US007297582B2

(12) United States Patent
Abadeer et al.

(10) Patent No.: US 7,297,582 B2
(45) Date of Patent: Nov. 20, 2007

(54) METHOD OF FORMING HIGH VOLTAGE N-LDMOS TRANSISTORS HAVING SHALLOW TRENCH ISOLATION REGION WITH DRAIN EXTENSIONS

(75) Inventors: Wagdi W. Abadeer, Jericho, VT (US); Jeffrey S. Brown, Middlesex, VT (US); Robert J. Gauthier, Jr., Hinesburg, VT (US); Jed H. Rankin, South Burlington, VT (US); William R. Tonti, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 305 days.

(21) Appl. No.: 10/991,936

(22) Filed: Nov. 18, 2004

(65) Prior Publication Data
US 2005/0090049 A1 Apr. 28, 2005

Related U.S. Application Data

(62) Division of application No. 10/249,766, filed on May 6, 2003, now Pat. No. 6,876,035.

(51) Int. Cl.
*H01L 21/336* (2006.01)
(52) U.S. Cl. ........................ 438/197; 438/221; 438/524
(58) Field of Classification Search ................ 438/197, 438/221, 230–231, 424, 524
See application file for complete search history.

(56) References Cited

U.S. PATENT DOCUMENTS 4,697,201 A 9/1987 Mihara (Continued)

FOREIGN PATENT DOCUMENTS

JP 10294463 2/2001

(Continued)

OTHER PUBLICATIONS

Nakamura, et al., "Complementary 25V LDMOS for Analog Applications Based on 0.6um BiMOS Technology," IEEEBCTM, 2000, pp. 94-97.

(Continued)

*Primary Examiner*—Thanhha S. Pham
(74) *Attorney, Agent, or Firm*—Gibb & Rahman, LLC; Anthony Canale

(57) ABSTRACT

A method and structure is disclosed for a transistor having a gate, a channel region below the gate, a source region on one side of the channel region, a drain region on an opposite side of the channel region from the source region, a shallow trench isolation (STI) region in the substrate between the drain region and the channel region, and a drain extension below the STI region. The drain extension is positioned along a bottom of the STI region and along a portion of sides of the STI. Portions of the drain extension along the bottom of the STI may comprise different dopant implants than the portions of the drain extensions along the sides of the STI. Portions of the drain extensions along sides of the STI extend from the bottom of the STI to a position partially up the sides of the STI. The STI region is below a portion of the gate. The drain extension provides a conductive path between the drain region and the channel region around a lower perimeter of the STI. The drain region is positioned further from the gate than the source region.

14 Claims, 6 Drawing Sheets

U.S. PATENT DOCUMENTS

| | | | |
|---|---|---|---|
| 5,282,018 | A | 1/1994 | Hiraki et al. |
| 5,341,011 | A | 8/1994 | Hshieh et al. |
| 5,369,045 | A | 11/1994 | Ng et al. |
| 5,466,616 | A | 11/1995 | Yang |
| 5,585,294 | A | 12/1996 | Smayling et al. |
| 5,684,319 | A | 11/1997 | Hebert |
| 5,696,010 | A | 12/1997 | Malhi |
| 5,757,038 | A | 5/1998 | Tiwari et al. |
| 5,811,850 | A | 9/1998 | Smayling et al. |
| 5,844,275 | A | 12/1998 | Kitamura et al. |
| 5,877,528 | A | 3/1999 | So |
| 6,037,194 | A | 3/2000 | Bronner et al. |
| 6,191,447 | B1 | 2/2001 | Baliga |
| 6,242,787 | B1 | 6/2001 | Nakayama et al. |
| 6,252,284 | B1 | 6/2001 | Muller et al. |
| 2001/0009790 | A1 | 7/2001 | Hsing |
| 2002/0197782 | A1* | 12/2002 | Kitamura ............... 438/200 |

FOREIGN PATENT DOCUMENTS

| | | |
|---|---|---|
| JP | 2001060686 | 3/2001 |
| JP | 2001068561 | 3/2001 |

OTHER PUBLICATIONS

Moscatelli et al., "LDMOS Implementation In a 0.35um BCD Technology (BCD6)", ISPSD 2000, pp. 323-326.

Huang et al., "Sub 50-nm FinFET:PMOS", IEDM, 1999, pp. 67-70.

Brisbin et al., "Hot Carrier Reliability and Design of N-LDMOS Transistor Arrays," IRW Final Report, 2001, pp. 44-48.

Kimura et al., "Short-Channel-Effect-Suppressed Sub-0.1-um Grooved-Gate MOSFET's With W Gate", IEEE Transactions on Electron Devices, vol. 42, No. 1, 1995, pp. 94-100.

Bricut, "Short-Channel Effect Immunity and Current Capability of Sub-0.1 Micron MOSFET'S Using a Recessed Channel", IEEE Transactions on Electron Devices, vol. 43, No. 8, 1996, pp. 1251-1255.

* cited by examiner

METHOD OF FORMING HIGH VOLTAGE N-LDMOS TRANSISTORS HAVING SHALLOW TRENCH ISOLATION REGION WITH DRAIN EXTENSIONS

CROSS-REFERENCE TO RELATED APPLICATIONS

This application is a division of U.S. application Ser. No. 10/249,766, filed on May 6, 2003, which is now U.S. Pat. No. 6,876,035.

BACKGROUND OF THE INVENTION

1. Field of the Invention

The present invention generally relates to transistors and more particularly to an improved N-type lateral double diffusion metal oxide semiconductor that has a shallow trench isolation region between the gate and the drain.

2. Description of the Related Art

Power semiconductor devices are currently being used in many applications. Such power devices include high-voltage integrated circuits, which typically include one or more high-voltage transistors, often on the same chip as low-voltage circuitry. A commonly used high-voltage component for these circuits is the lateral double diffused MOS transistor (LDMOS). LDMOS structures used in high-voltage integrated circuits may generally be fabricated using some of the same techniques used to fabricate the low voltage circuitry or logic circuitry. In general, these existing LDMOS structures are fabricated in a thick epitaxial layer of opposite conductivity type to the substrate or they use a thin epitaxial layer and apply the RESURF (reduced surface field) principle (e.g., see U.S. Pat. No. 6,242,787, that is incorporated herein by reference, for a complete description of RESURF) to equally distribute the applied drain voltage laterally across the silicon surface in the drift region of the device.

High-power applications call for the use of such lateral double diffused MOS transistors primarily because they possess lower "on" resistance ("Rdson"), faster switching speed, and lower gate drive power dissipation than their bi-polar counterparts. These devices have heretofore also been strongly associated with bi-polar based process flows when integrated into a Bi-CMOS (bipolar complementary metal oxide semiconductor) environment.

SUMMARY OF THE INVENTION

The invention provides a transistor having a gate, a channel region below the gate, a source region on one side of the channel region, a drain region on an opposite side of the channel region from the source region, a shallow trench isolation (STI) region in the substrate between the drain region and the channel region, and a drain extension below the STI region. The drain extension is positioned along the bottom of the STI region and along the portion of sides of the STI. Portions of the drain extension along the bottom of the STI may comprise different dopant implants than the portions of the drain extensions along the sides of the STI. Portions of the drain extensions along sides of the STI extend from the bottom of the STI to a position partially up the sides of the STI. The STI region is below a portion of the gate. The drain extension provides a conductive path between the drain region and the channel region around a lower perimeter of the STI. The drain region is positioned further from the gate than the source region.

The invention also discloses a method of manufacturing a transistor. First, the method forms a trench in a substrate. Next, the method partially fills the trench with a sacrificial material, and then forms spacers in the trench above the sacrificial material. The method removes the sacrificial material and implants a drain extension through the trench into exposed portions of the substrate. The drain extension is implanted to regions of the substrate along sides and the bottom of the trench. The method fills the trench with a shallow trench isolation (STI) material. The method defines a channel region in the substrate on one side the STI material. The invention forms a source region in the substrate on an opposite side of the channel region from the STI material. The method then forms a drain region in the substrate on an opposite side of the STI material from the channel region. Lastly, the method forms a gate above the channel region.

The implanting process includes a vertical implant which forms a drain extension in the portion of the substrate along the bottom of the substrate and an angled implant to form the drain extension in the portion of the substrate along the sides of the substrate. The spacers and the sacrificial material control the size and location of the drain extension. The implanting process forms portions of the drain extensions along sides of the STI from the bottom of the STI to a position partially up the sides of the STI. The forming of the gate extends a portion of the gate over the STI material. The drain extension provides a conductive path between the drain region and the channel region around a lower perimeter of the STI. The process of forming the drain region positions the drain region further from the gate than the source region. The process of implanting the drain extension includes protecting regions other than the trench to limit the implanting process to the trench.

The manufacturing process shown above is advantageous when compared to conventional manufacturing processes because the invention forms the drain extension directly through the trench opening. Thus, a lower energy implant can be used than is used conventionally. Further, the penetration depth and unwanted diffusion is easily controlled because the implant is being made through the trench opening. In addition, the trench opening aligns the impurity implant more precisely than conventional methods that must pass the higher energy implant through the recessed oxide. Therefore, as shown above, the invention provides improved channel length control with maskless trench aligned implant and reduced straggle (unwanted diffusion) of the deep implant. This reduces on resistance (Rdson), and overlap capacitance (Cov), and increases the on current (Ion).

BRIEF DESCRIPTION OF THE DRAWINGS

The invention will be better understood from the following detailed description of a preferred embodiment(s) of the invention with reference to the drawings, in which.

DETAILED DESCRIPTION OF THE PREFERRED EMBODIMENT

Integration of microelectronics into consumer appliances, automotive, space technologies, etc., drives a market utilizing high performance CMOS (complementary metal oxide semiconductor), BJT's (bipolar junction transistors) and power MOS (metal oxide semiconductor) drivers. The lateral DMOS (LDMOS) transistor is typically chosen as the driving transistor, capable of switching high voltages.

Figure 1:
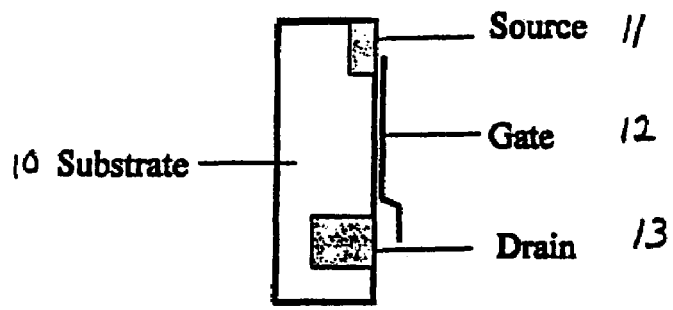
FIG. 1 is a schematic diagram of a LDMOS.

FIG. 1 illustrates a typical N-DMOS device schematic. The device includes a substrate 10, source 11, gate 12, and drain 13. In the device off state, the voltage of the drain 13 (Vdrain) is typically at a high positive potential (i.e., the "appliance switching or mixed level"). The voltage of the gate 12 (Vgate) is typically at or near ground, i.e., less than the turn on potential of the device. The voltage differential that will exist between the drain and gate presents significant stress upon the gate oxide and it is an important design goal to protect the gate oxide from being destroyed by these large voltages. The voltage of the source 11 (Vsource) may be at ground, or at the CMOS internal level, and for sake of simplicity, the voltage of the substrate 10 (Vsubstrate) is at ground also. In the on state, the Vdrain to source is typically at hundreds of millivolts, and the Vgate to source voltage is at the CMOS internal level. A typical N-LDMOS threshold voltage is approximately 1 volt. Thus, in the preferred on-state Vgs>>Vt, and Vds<<(Vgs−Vt), thus the device operates in a linear mode. Vdrain, or the external appliance potential can approach voltage levels in excess of 20 volts, while the internal CMOS levels are typically between 1 volt and 3.3 volts. Internally, the CMOS levels cannot operate at the appliance voltage levels, as gate oxides would be destroyed, and the appliance voltages cannot operate at the internal CMOS levels, as the voltages are too low for appliance operation.

Figure 2:
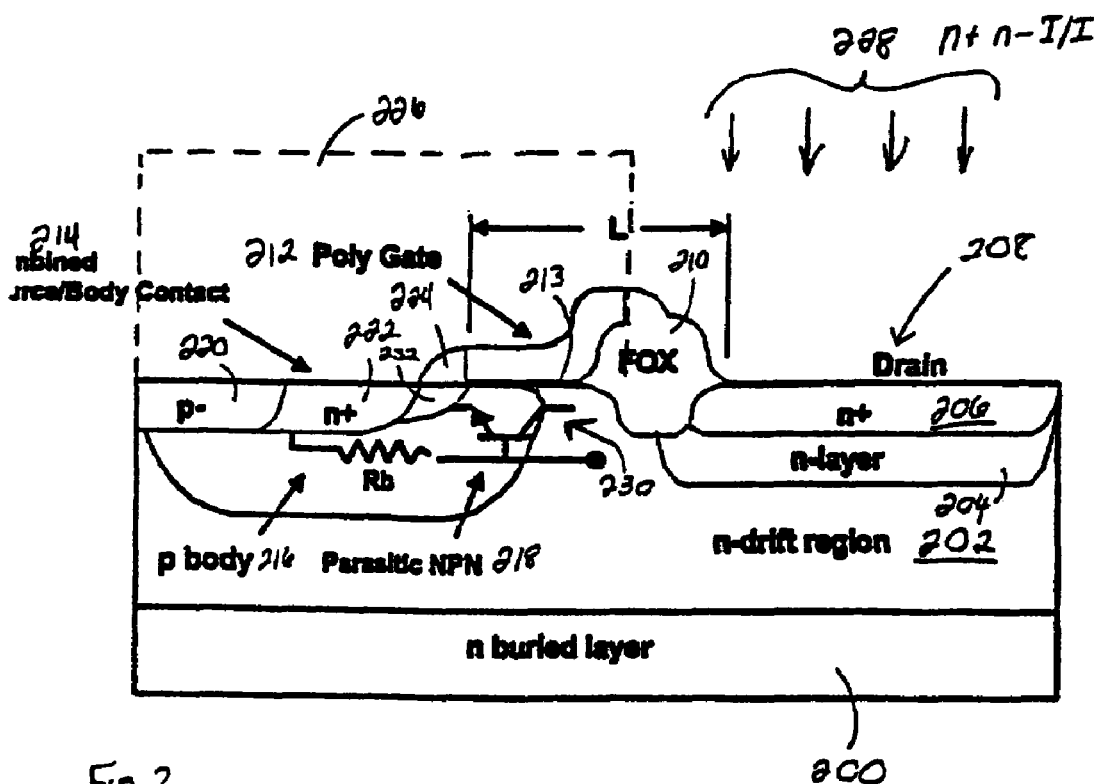
FIG. 2 is a schematic diagram of a LDMOS.

FIG. 2 displays a cross-section of a 24 volt N-LDMOS device. Some of the elements illustrated in FIG. 2 include the n buried layer 200, the body 216, a combined source/body contact 214 (p− doped and n+ doped regions 220, 222, and n+ extension 232), a sidewall spacer 224, and a polysilicon gate 212. Item 218 superimposes the parasitic NPN schematic over the structure. The drain 208 includes n+ region 206. The extended drain region, comprising an n-drift region 202 and an n−layer 204, extends under a field oxide 210 for on-resistance (Rdson) control. The polysilicon gate 212 extends over the field oxide 210 and a gate oxide 213 is below the gate 212. To minimize device area the p-body and source terminals are usually common 214 but for substrate current analysis, device arrays can also be fabricated with separate source and body contacts. The threshold voltage (Vt) for this device is ~1.0 V.

The performance parameters for an optimized design are low and controlled Rdson/Overlap Capacitance at the drain terminal, and high Vdrain breakdown voltage. This implies that a "high" drive current is the result of a minimized and controlled Rdson for the LDMOS device. In FIG. 2, common practice of designing the high voltage drain 208 uses a photo-resist mask 226 over the grown thick oxide. The n− deep part 204 of the junction is implanted 228 through the photo-resist 226, and the shallow n+ part 206 of the junction follows 228. This process results in a device having a large straggle in the control of the lateral extent due primarily to the large implant energy (e.g., 80 Kev) required to reach through the recessed oxide and the mask alignment to the recessed oxide.

Figure 3:
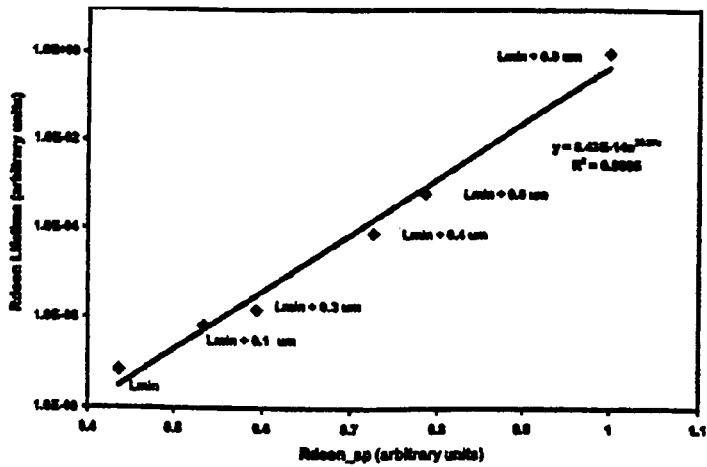
FIG. 3 is a chart showing the performance of a LDMOS.

The limitations described above also limit the minimum channel length design for such a device, further constraining the chip function due to I/O requirements. More specifically, the channel region 230 runs approximately between the n− layer 204 and the n+ doped region 222. The size and shape of the bird's beak of the field oxide 210 (e.g., the left and right sides of the field oxide 210 in FIG. 2) restricts the length of the channel region 230 and is a very difficult feature to control. Thus, the bird's beak shown in FIG. 2 substantially limits the control over channel length. Device layout has a substantial impact on LDMOS HC performance. FIG. 3 is taken from D. Brisbon et al., "Hot Carrier Reliability and Design of N-LDMOS Transistor Arrays" 2001 IRW Final Report (incorporated herein by reference) and displays measured Rdson lifetime as a function of specific on-resistance (Rdson_sp) and source to drain edge spacing L, where: Rdson_sp=Rdson*Area Array. FIG. 3 shows that increasing L by just 0.9 μm increases Rdson HC lifetime by seven orders of magnitude, though this improved HC performance is attained at the expense of increased Rdson_sp and array area. Therefore, control of the channel length (e.g., source to drain spacing) is crucial to device performance and longevity. In addition, lack of control of the L-DMOS high voltage junction leads to hot carrier reliability issues that parallel spacer-induced damage in CMOS.

The invention provides control over the source to drain spacing by integrating shallow trench isolation (STI) and low energy pre-implants prior to isolating adjacent transistors. The pre-implant is performed to dope the drain extension. One additional control feature provided by the invention is a STI sidewall spacer formation that is used to control the out-diffusion of the self-aligned junction floor pre-implant.

Figure 4:
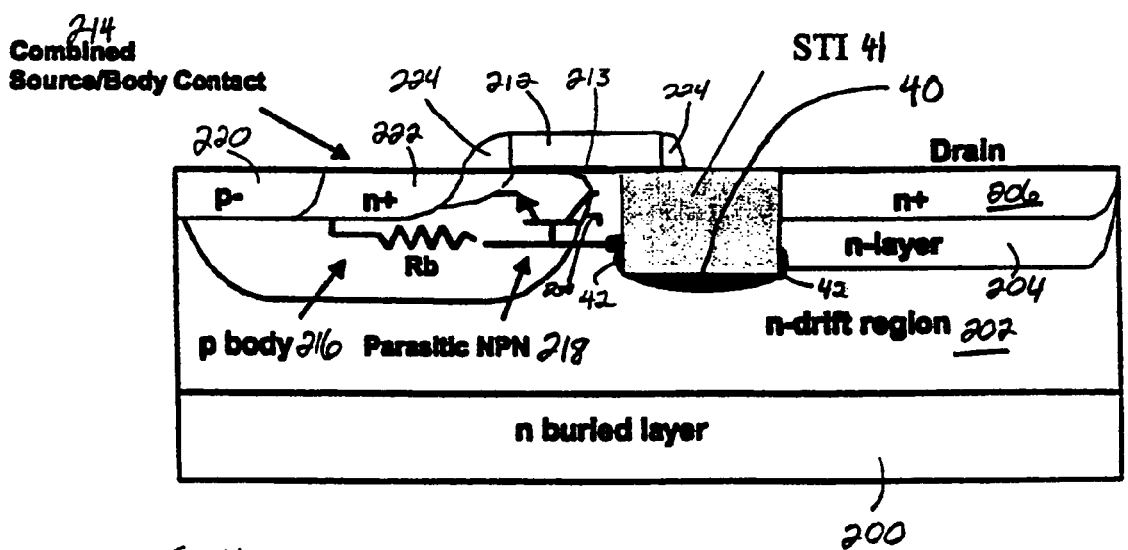
FIG. 4 is a schematic diagram of a LDMOS.

FIG. 4 illustrates this self-aligned junction floor n− implant 40 below the shallow trench isolation 41 that is added to the conventional structure for control of both source to drain spacing and Rdson. The implant 40 replaces the conventional drain extension and comprises the drain extension in the inventive structure. In addition, in a second embodiment (discussed in greater detail below with respect to FIGS. 9 and 10), the invention provides vertical drain extensions 42 on the side walls of the STI 41. With the vertical drain extensions 42, the parasitic device resistance is easily controlled. A continuous conductive path is supplied around the periphery of the shallow trench isolation 41 from the drain 206, 204 directly to the channel region 230. In addition, the formation of the trench structure 41 eliminates the "birds beak" field oxide 210 shape and thereby avoids all disadvantages associated with a birds beak structure, such as difficulty in controlling channel length, Vdrain degradation, etc.

The structure shown in FIG. 4 benefits from a number of advantages when compared to the structure shown FIG. 2 because the high voltage drain 206 is thoroughly insulated from the gate 212 (and underlying sensitive gate oxide 213) by the shallow trench isolation region 41. Since the STI trench is the first element in this process, it is easily aligned with (e.g., self-aligned) with the later formed CMOS device. To the contrary, in FIG. 2, the field oxide 210 encroaches upon the CMOS gate.

FIGS. 5-8 show one embodiment where the deep drain implant is controlled by using a low energy STI trench. In this embodiment, the shallow trench isolation region 41 is formed before the remaining structures of the transistor are formed. Therefore, such structures are not illustrated in the drawings. However, one ordinarily skilled in the art would understand that the shallow trench isolation region 41 and drain extension 40 could easily be formed at many different processing points during the creation of the transistor, and the embodiments described herein are intended to cover all such possible methodologies.

Figure 5:
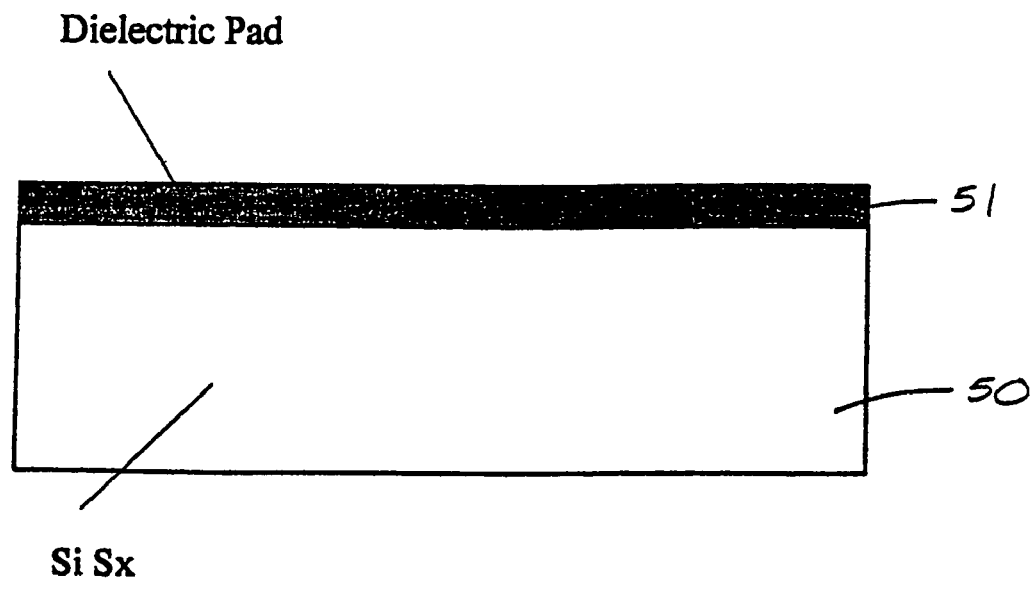
FIG. 5 is a schematic diagram of a partially completed LDMOS.
Figure 6:
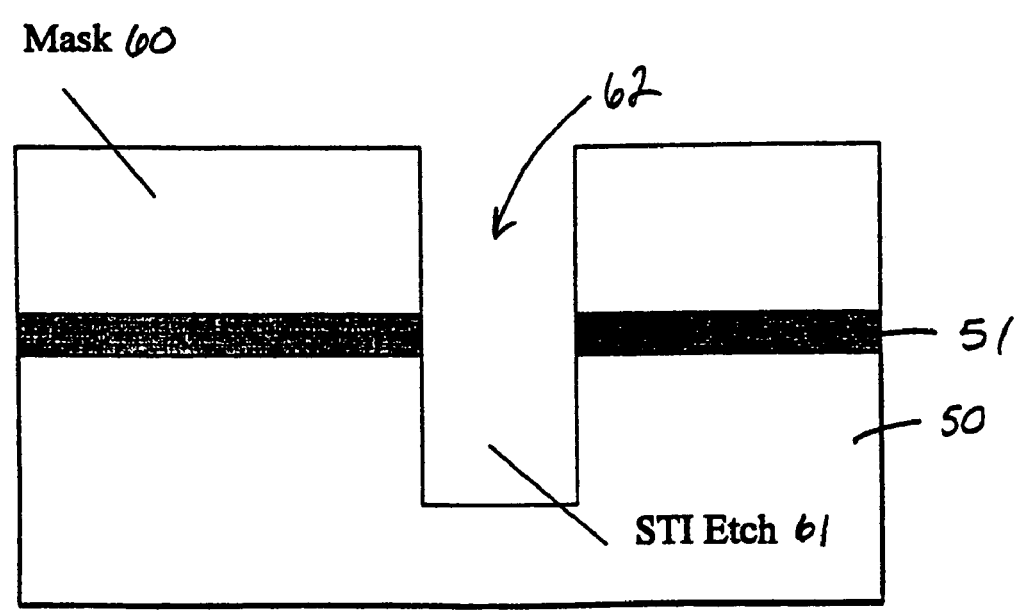
FIG. 6 is a schematic diagram of a partially completed LDMOS.

Turning to FIG. 5, the invention begins with a substrate 50 (e.g., silicon, pre-doped or undoped) with an overlying dielectric pad 51 formed according to well known processes. In FIG. 6, a mask 60 (such as a photolithographic mask) is formed over the pad material 51 and patterned to create an opening 62. An etching process is then performed to remove the exposed portions of the pad material 51 and the silicon 50 to create a trench 61 in the silicon 50.

Figure 7:
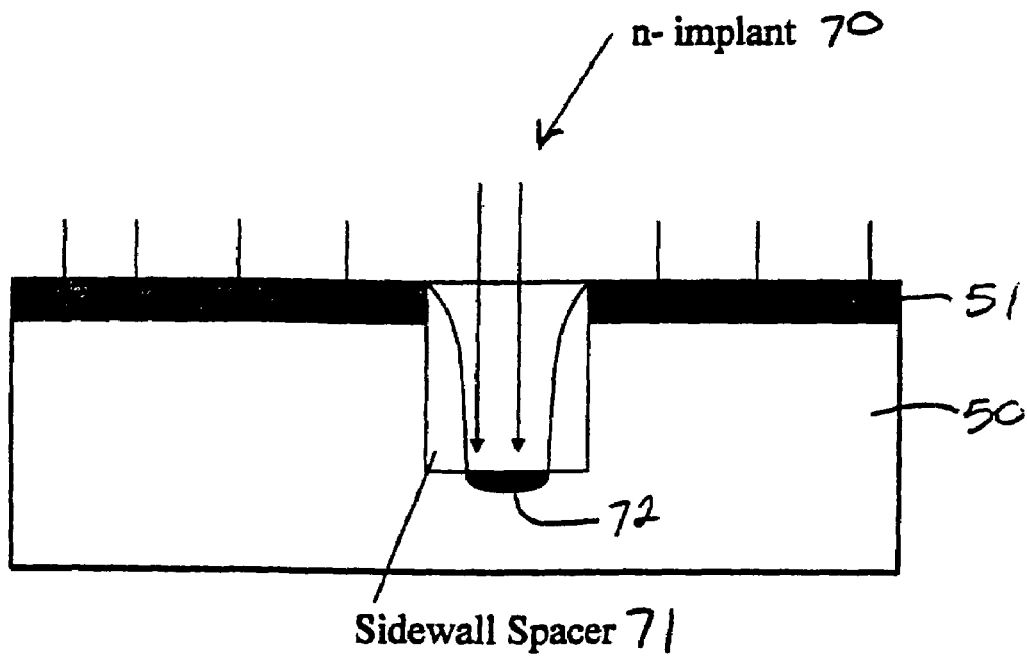
FIG. 7 is a schematic diagram of a partially completed LDMOS.

The mask 60 is then removed, as shown in FIG. 7. Sidewall spacers 71 (e.g., nitride, oxide, etc.) are then formed in the trench 61. The processes for forming sidewall spacers are well known to those ordinarily skilled in the art. For example, one process deposits or grows the spacer material and then performs a directional etch that removes material from horizontal surfaces at a higher rate than it removes material from vertical surfaces, thereby leaving the spacers only on the sidewalls of the structure. Any such processes could be used to form the sidewall spacers 71. An implant (e.g., n– implant) 70 is then performed to create the impurity implantation region 72. By directly implanting into the silicon 50, a lower energy and more highly controlled implant can be utilized. Further, the size of the spacers 71 can be varied to provide precise control regarding the size of the impurity region 72.

Figure 8:
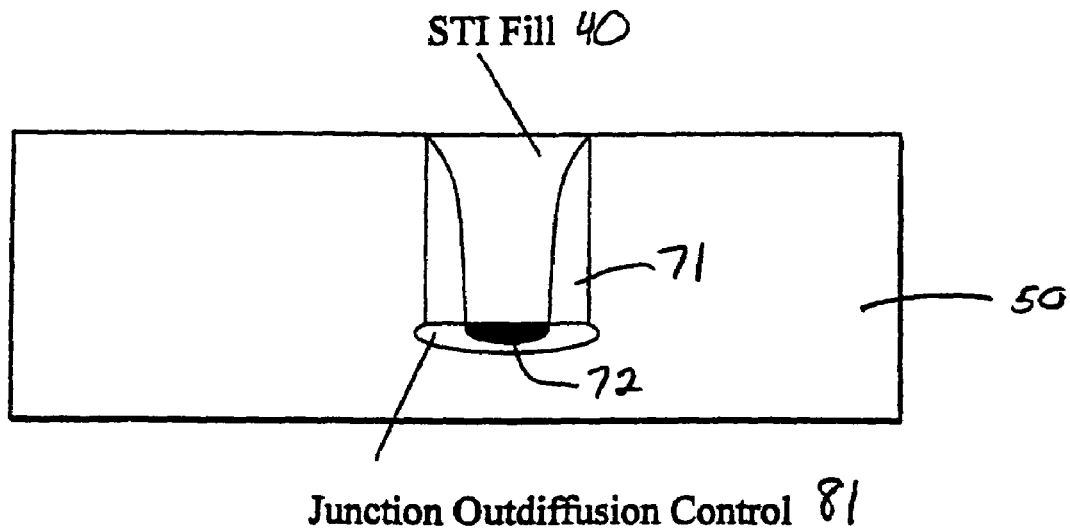
FIG. 8 is a schematic diagram of a partially completed LDMOS.

In FIG. 8, the opening 61 is filled with insulating shallow trench isolation material 41 (e.g., nitride, oxide, etc.) and a thermal annealing process is performed on the structure to diffuse the impurity implantation region 72 outward to create the junction outdiffusion region 81. After this, conventional processing such as that described in U.S. 6,242,787 (incorporated herein are reference) is performed to create the drain region, source, gate, insulators, contacts, etc. that form the final functional device shown in FIG. 4. The STI region 41 can comprise a portion of the gate oxide 213 in the final structure.

Figure 9:
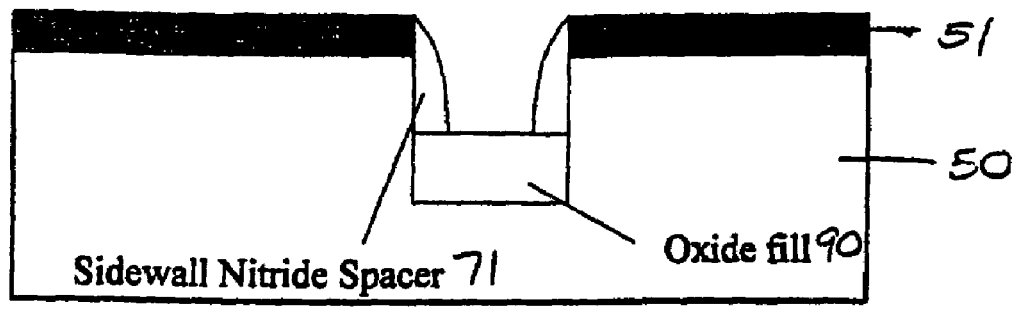
FIG. 9 is a schematic diagram of a partially completed LDMOS.
Figure 10:
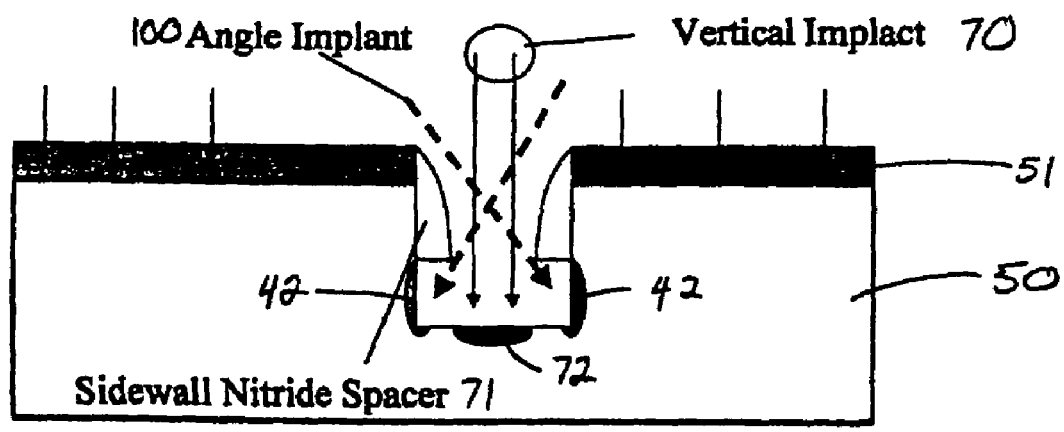
FIG. 10 is a schematic diagram of a partially completed LDMOS.

FIGS. 9 and 10 illustrate a second embodiment where the deep drain implant is controlled by utilizing an angled implant method. More specifically, the structure shown in FIG. 9 is similar to the structure shown in FIG. 7, except that in FIG. 9, before the sidewall spacers 71 are formed, an oxide fill 90 is grown in the lower portion of the trench 61. Then, as shown in FIG. 10, the oxide film 90 is removed and the vertical implant 70 is performed. In addition one or more angled implants 100 (with the same or different impurities, concentrations, etc.) are performed to implant impurities 42 along one or both of the exposed sidewalls of the trench that are below the spacers 71. The depth at which the oxide fill 90 is grown determines the height of the exposed portion below the spacers 71 and correspondingly determines how far up the trench sidewall from the bottom of the trench the sidewall impurity regions 42 will extend. While the sidewall impurity regions 42 are shown as extending approximately halfway up the trench sidewalls, their position can be controlled (by the depth of the oxide fill 90) depending upon the individual circuit designer's requirements. Next, the trench is filled with the STI material and the remaining device structures are formed as was done in FIG. 8.

Figure 11:
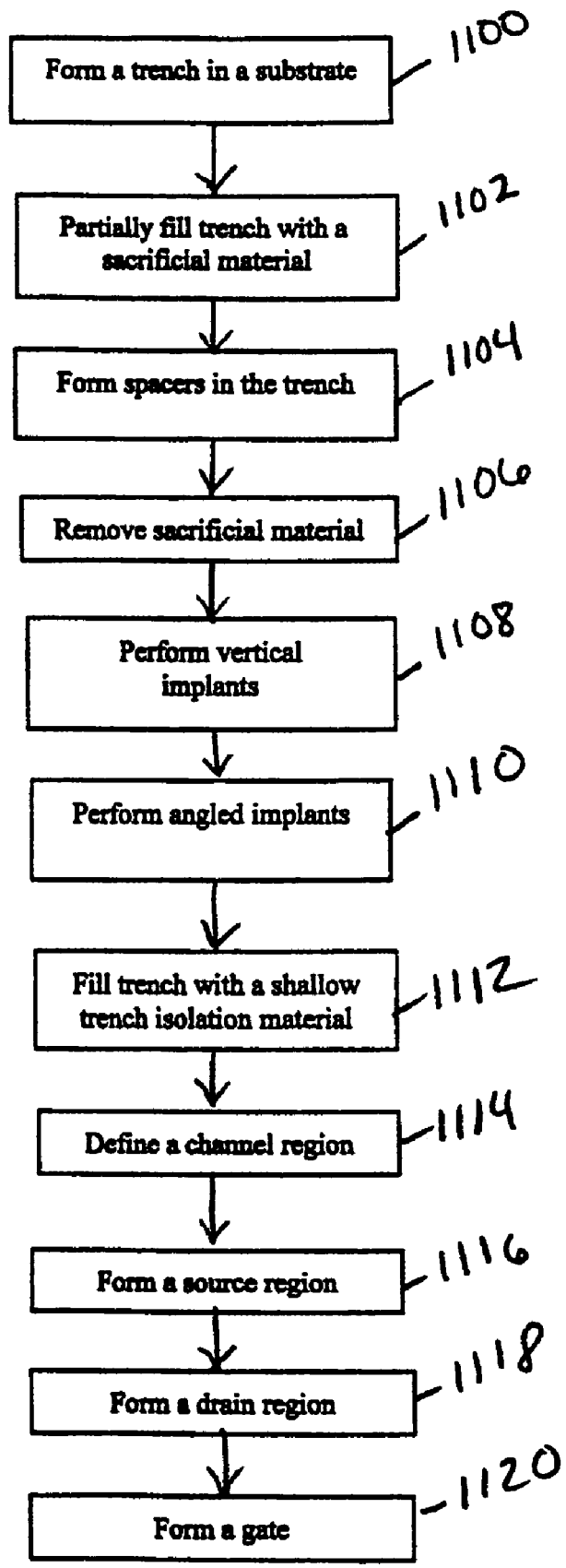
FIG. 11 is a flowchart illustrating the embodiment of the invention.
Figure 1:
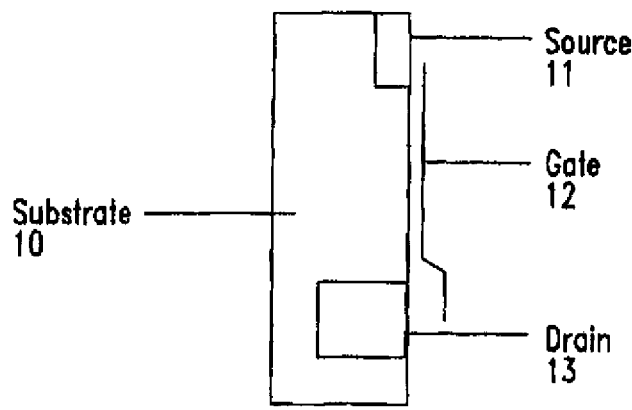
Figure 2:
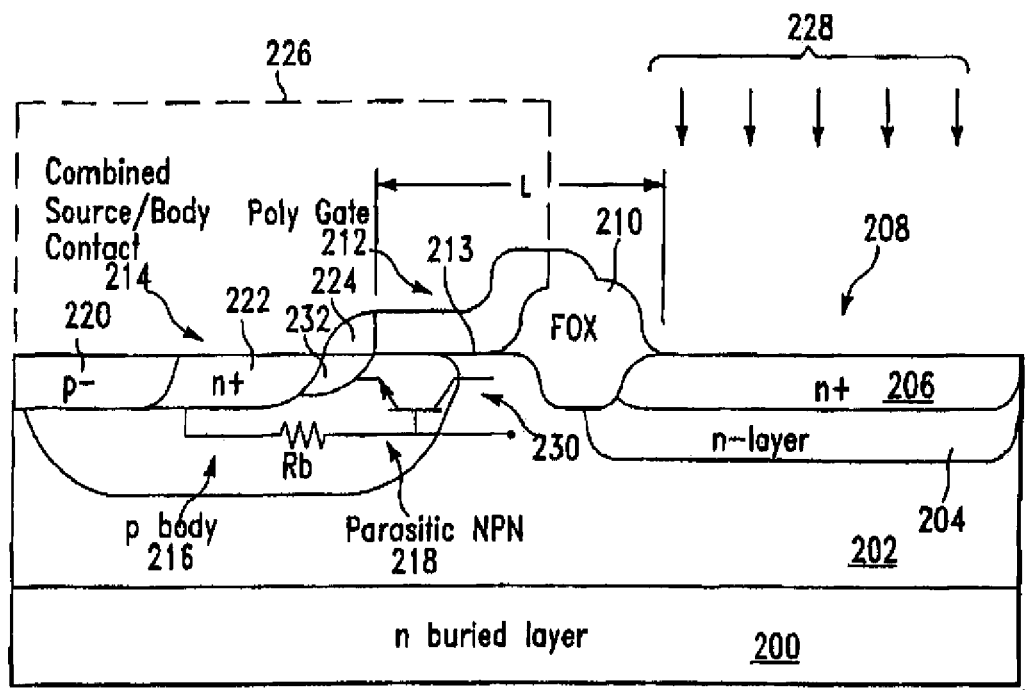
Figure 3:
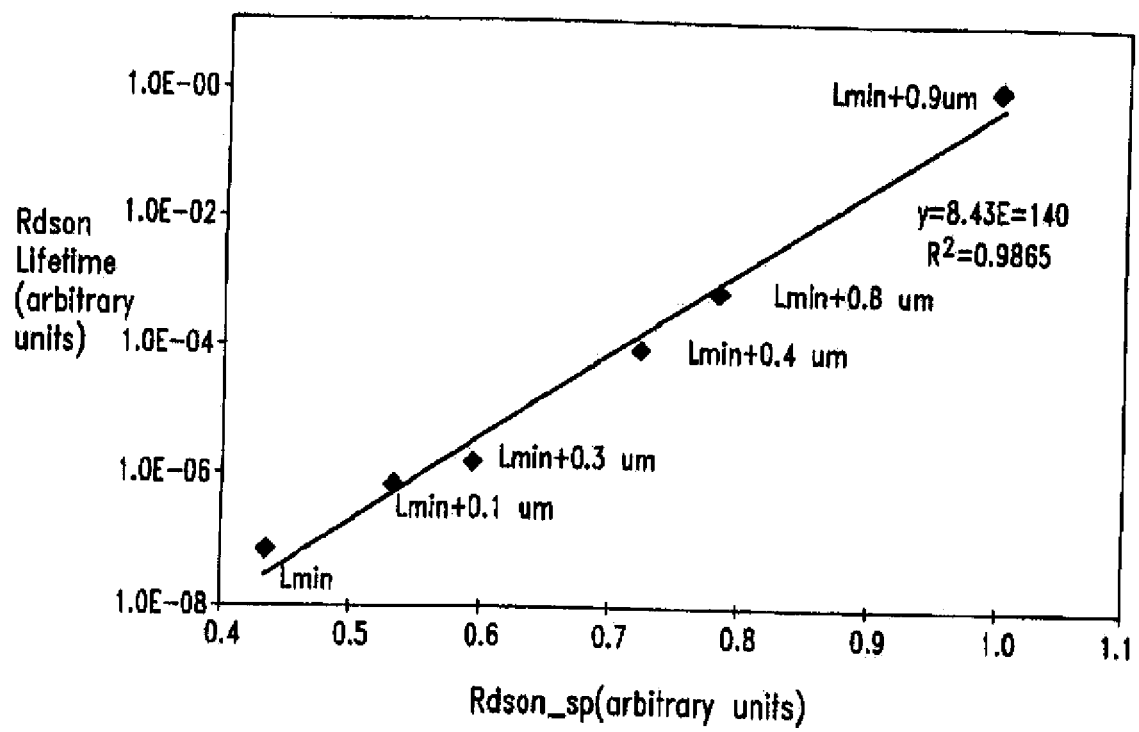
Figure 4:
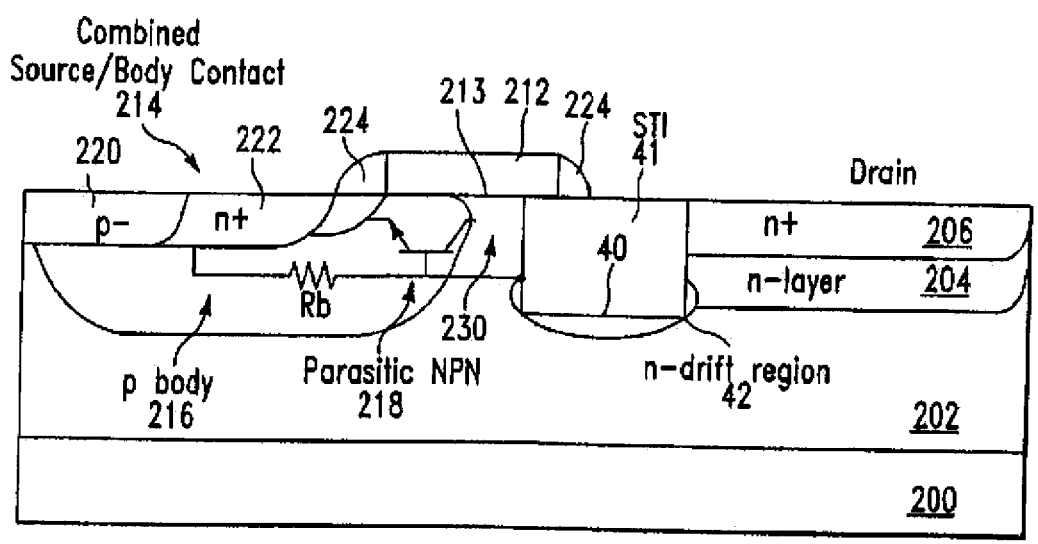
Figure 5:
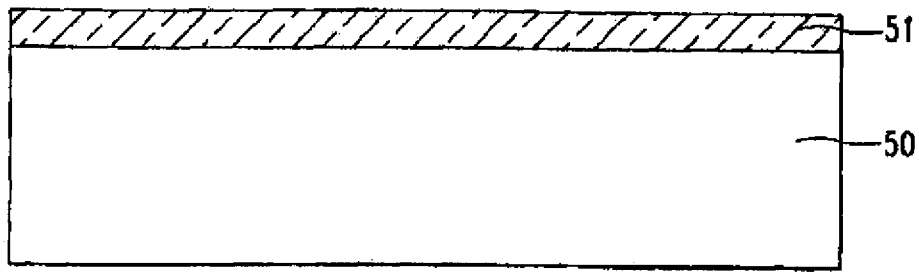
Figure 6:
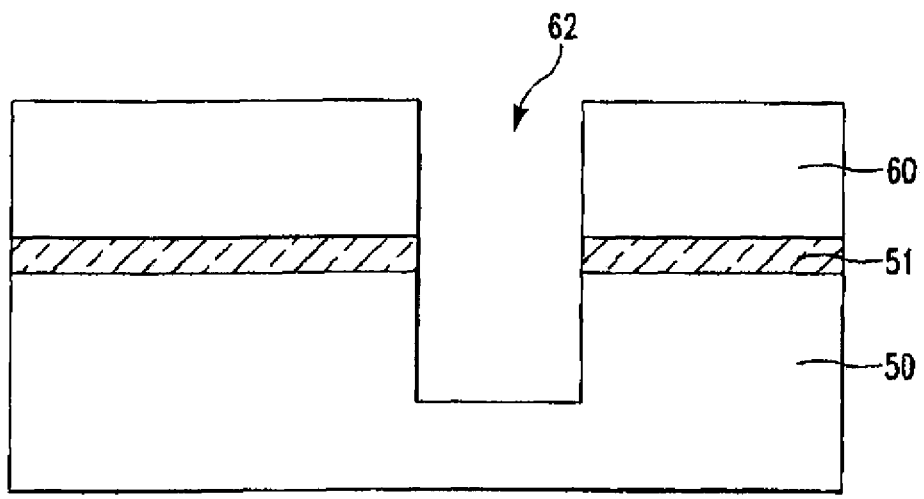
Figure 7:
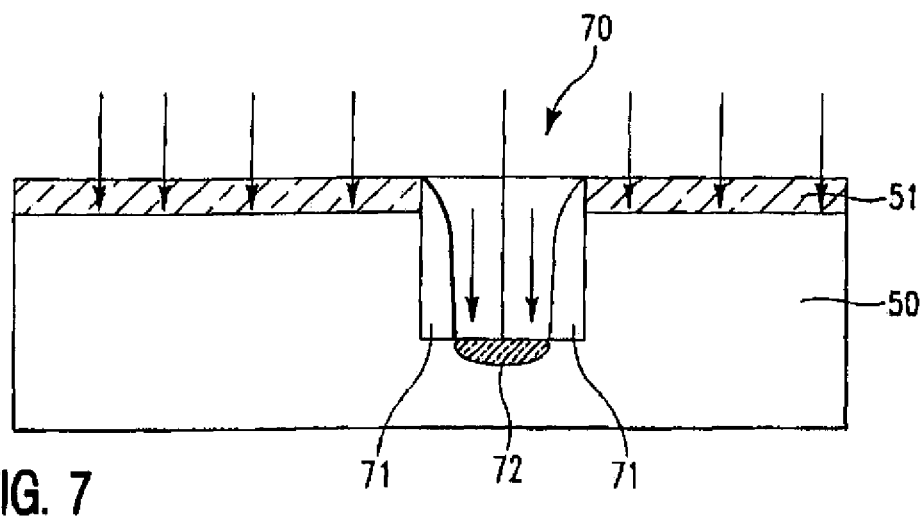
Figure 8:
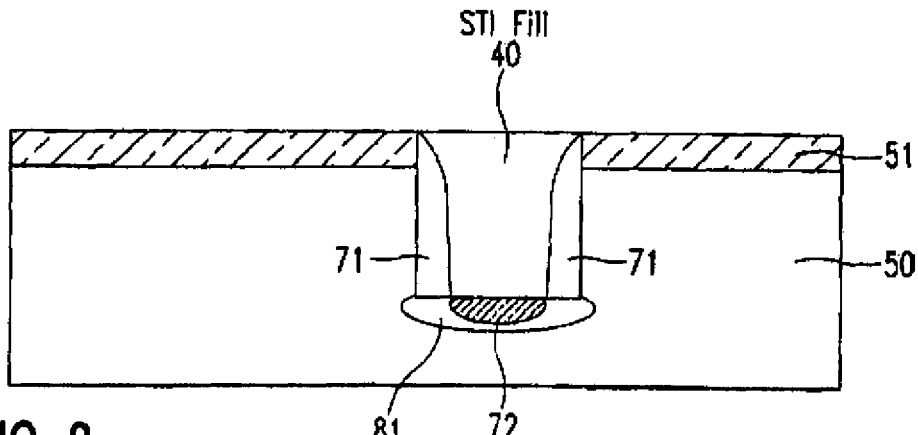
Figure 9:
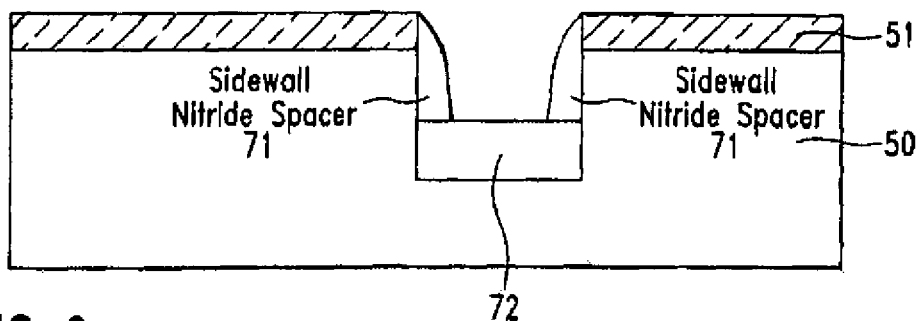
Figure 10:
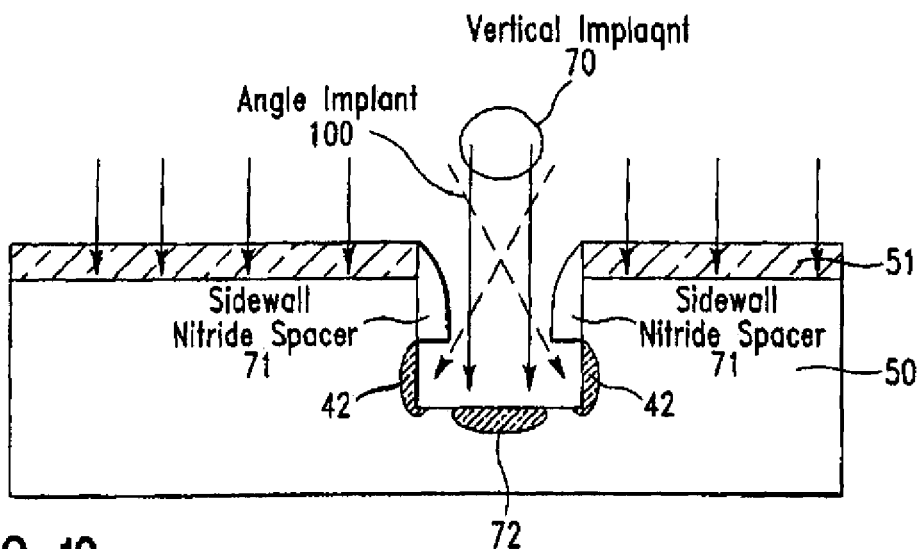
Figure 11:
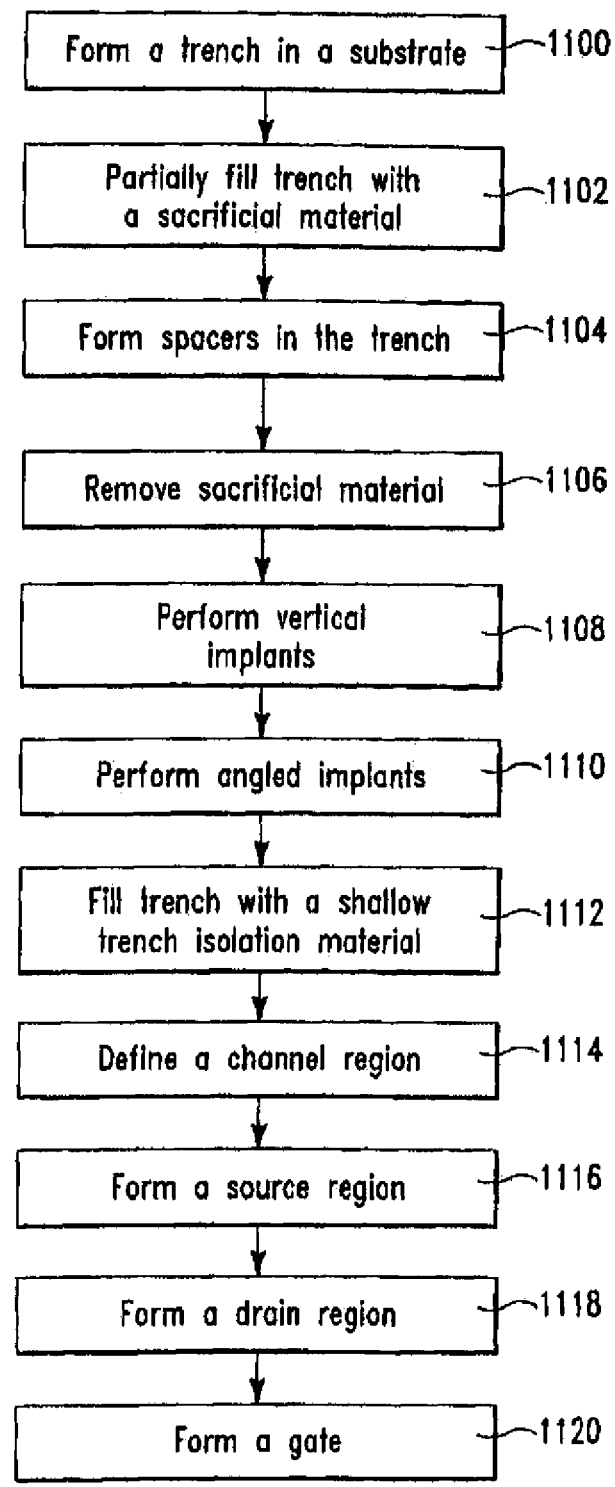

FIG. 11 is a flow chart illustrating one embodiment of the invention. In item 1100, the invention forms a trench in a substrate. Next, in item 1102, the invention partially fills the trench with a sacrificial material. The invention then forms spacers in the trench above the sacrificial material in item 1104. In item 1106, the invention removes the sacrificial material. Next, in item 1108, the invention performs a vertical implants. In item 1110, the invention performs an angled implant. In item 1112, the invention fills the trench with a shallow trench isolation (STI) material. In item 1114, the invention defines a channel region. In item 1116, the invention forms a source region. In item 1118, the invention forms a drain region. In item. 1120, the invention forms a gate.

The manufacturing process shown above is advantageous when compared to conventional manufacturing processes because the invention forms the drain extension 40, 42 directly through the trench opening 61. Thus, a lower energy implant (e.g., 10-40 Kev) can be used. This is a substantial improvement over the implants required through the Fox (210 in FIG. 1). Fox implants are typically in excess of 80 Kev, and as such they have a very large lateral straggle, and suffer high implant damage. The high straggle effects the control of Lmin, and the implant damage causes high device junction leakage. Further, the penetration depth and unwanted diffusion by using the trench process is easily controlled because the implant is made through the trench opening. In addition, the trench opening 61 aligns the impurity implant more precisely than conventional methods that must pass the higher energy implant through the recessed oxide 210. Therefore, as shown above, the invention provides improved channel length control with maskless trench aligned implant and reduced straggle (unwanted diffusion) of the deep implant. This reduces on resistance (Rdson), and overlap capacitance (Cov), and increases the on current (Ion).

While the invention has been described in terms of preferred embodiments, those skilled in the art will recognize that the invention can be practiced with modification within the spirit and scope of the appended claims.

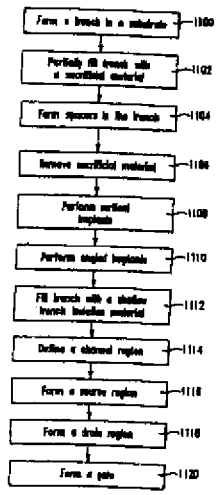

What is claimed is:

1. A method of manufacturing a transistor comprising:
    forming a trench in a substrate;
    forming spacers in said trench;
    after forming said spacers, implanting a drain extension through said trench into said substrate;
    filling said trench with a shallow trench isolation (STI) material;
    defining a channel region in said substrate on one side said STI material;
    forming a source region in said substrate on an opposite side of said channel region from said STI material;
    forming a drain region in said substrate on an opposite side of said STI material from said channel region; and
    forming a gate above said channel region.

2. The method in claim 1, wherein said spacers control a size of said drain extension.

3. The method in claim 1, wherein said forming of said gate extends a portion of said gate over said STI material.

4. The method in claim 1, wherein said drain extension provides a conductive path between said drain region and said channel region around a lower perimeter of said STI.

5. The method in claim 1, wherein said process of forming said drain region positions said drain region further from said gate than said source region.

6. The method in claim 1 wherein said process of implanting said drain extension comprises protecting regions other than said trench to limit said implanting process to said trench.

7. A method of manufacturing a transistor comprising:
forming a trench in a substrate;
partially filling said trench with a sacrificial material;
forming spacers in said trench above said sacrificial material;
removing said sacrificial material;
implanting a drain extension through said trench into exposed portions of said substrate, wherein said drain extension is implanted to regions of said substrate along sides and a bottom of said trench;
filling said trench with a shallow trench isolation (STI) material;
defining a channel region in said substrate on one side said STI material;
forming a source region in said substrate on an opposite side of said channel region from said STI material;
forming a drain region in said substrate on an opposite side of said STI material from said channel region; and
forming a gate above said channel region.

8. The method in claim 7, wherein said implanting process comprises a vertical implant to form said drain extension in said portion of said substrate along said bottom of said substrate and an angled implant to form said drain extension in said portion of said substrate along said sides of said substrate.

9. The method in claim 7, wherein said spacers and said sacrificial material control the size and location of said drain extension.

10. The method in claim 7, wherein said implanting process forms portions of said drain extensions along sides of said STI from said bottom of said STI to a position partially up said sides of said STI.

11. The method in claim 7, wherein said forming of said gate extends a portion of said gate over said STI material.

12. The method in claim 7, wherein said drain extension provides a conductive path between said drain region and said channel region around a lower perimeter of said STI.

13. The method in claim 7, wherein said process of forming said drain region positions said drain region further from said gate than said source region.

14. The method in claim 7, wherein said process of implanting said drain extension comprises protecting regions other than said trench to limit said implanting process to said trench.

* * * * *

UNITED STATES PATENT AND TRADEMARK OFFICE
CERTIFICATE OF CORRECTION

PATENT NO. : 7,297,582 B2
APPLICATION NO. : 10/991936
DATED : November 20, 2007
INVENTOR(S) : Abadeer et al.

It is certified that error appears in the above-identified patent and that said Letters Patent is hereby corrected as shown below:

The Title Page, showing an illustrative figure, should be deleted and substitute therefor the attached title page.

Please substitute Figs. 1-11 of the drawings with the attached formal drawings of Figs. 1-11.

Signed and Sealed this

Twenty-second Day of September, 2009

David J. Kappos
*Director of the United States Patent and Trademark Office*

(12) United States Patent
Abadeer et al.

(10) Patent No.: US 7,297,582 B2
(45) Date of Patent: Nov. 20, 2007

(54) METHOD OF FORMING HIGH VOLTAGE N-LDMOS TRANSISTORS HAVING SHALLOW TRENCH ISOLATION REGION WITH DRAIN EXTENSIONS

(75) Inventors: Wagdi W. Abadeer, Jericho, VT (US); Jeffrey S. Brown, Middlesex, VT (US); Robert J. Gauthier, Jr., Hinesburg, VT (US); Jed H. Rankin, South Burlington, VT (US); William R. Tonti, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 305 days.

(21) Appl. No.: 10/991,936

(22) Filed: Nov. 18, 2004

(65) Prior Publication Data

US 2005/0090049 A1    Apr. 28, 2005

Related U.S. Application Data

(62) Division of application No. 10/249,766, filed on May 6, 2003, now Pat. No. 6,876,035.

(51) Int. Cl.
H01L 21/336     (2006.01)

(52) U.S. Cl. .................. 438/197; 438/221; 438/524

(58) Field of Classification Search .......... 438/197, 438/221, 230–231, 424, 524
See application file for complete search history.

(56) References Cited

U.S. PATENT DOCUMENTS 4,697,201 A    9/1987    Mihara (Continued)

FOREIGN PATENT DOCUMENTS

JP    10294463    2/2001

(Continued)

OTHER PUBLICATIONS

Nakamura, et al., "Complementary 25V LDMOS for Analog Applications Based on 0.6um BiMOS Technology," IEEEBCTM, 2000, pp. 94-97.

(Continued)

*Primary Examiner*—Thanhha S. Pham
(74) *Attorney, Agent, or Firm*—Gibb & Rahman, LLC; Anthony Canale

(57)    ABSTRACT

A method and structure is disclosed for a transistor having a gate, a channel region below the gate, a source region on one side of the channel region, a drain region on an opposite side of the channel region from the source region, a shallow trench isolation (STI) region in the substrate between the drain region and the channel region, and a drain extension below the STI region. The drain extension is positioned along a bottom of the STI region and along a portion of sides of the STI. Portions of the drain extension along the bottom of the STI may comprise different dopant implants than the portions of the drain extensions along the sides of the STI. Portions of the drain extensions along sides of the STI extend from the bottom of the STI to a position partially up the sides of the STI. The STI region is below a portion of the gate. The drain extension provides a conductive path between the drain region and the channel region around a lower perimeter of the STI. The drain region is positioned further from the gate than the source region.

14 Claims, 6 Drawing Sheets